(12) United States Patent
Ishizaki et al.

(10) Patent No.: US 12,117,354 B2
(45) Date of Patent: Oct. 15, 2024

(54) CAPACITANCE DETECTION SENSOR, CAPACITANCE DETECTION SENSOR MODULE AND STATE DETERMINATION METHOD USING CAPACITANCE DETECTION SENSOR

(71) Applicants: HONDA MOTOR CO., LTD., Tokyo (JP); The University of British Columbia, Vancouver (CA)

(72) Inventors: Ryusuke Ishizaki, Wako (JP); John D. W. Madden, Vancouver (CA); Mirza S. Sarwar, Vancouver (CA); Yuta Dobashi, Vancouver (CA)

(73) Assignees: Honda Motor Co., Ltd, Tokyo (JP); The University of British Columbia, Vancouver (CA)

( * ) Notice: Subject to any disclaimer, the term of this patent is extended or adjusted under 35 U.S.C. 154(b) by 284 days.

(21) Appl. No.: 17/764,725

(22) PCT Filed: Jul. 28, 2020

(86) PCT No.: PCT/JP2020/028929
§ 371 (c)(1),
(2) Date: Mar. 29, 2022

(87) PCT Pub. No.: WO2021/065177
PCT Pub. Date: Apr. 8, 2021

(65) Prior Publication Data
US 2022/0316964 A1 Oct. 6, 2022

(30) Foreign Application Priority Data
Oct. 3, 2019 (JP) .................................. 2019-182941

(51) Int. Cl.
*G01L 1/14* (2006.01)
*G01D 5/24* (2006.01)

(52) U.S. Cl.
CPC . *G01L 1/14* (2013.01); *G01D 5/24* (2013.01)

(58) Field of Classification Search
CPC . G01L 1/14; G01D 5/24; G01D 5/241; G01V 3/088; G01V 3/00; H03K 17/975;
(Continued)

(56) References Cited

U.S. PATENT DOCUMENTS

| | | |
|---|---|---|
| 5,682,788 A | 11/1997 | Netzer |
| 2012/0299605 A1 | 11/2012 | Wakabayashi et al. |

(Continued)

FOREIGN PATENT DOCUMENTS

| | | | |
|---|---|---|---|
| JP | 2010-133791 A | 6/2010 | |
| JP | 2013-007739 A | 1/2013 | |

(Continued)

OTHER PUBLICATIONS

Office Action dated Nov. 7, 2023 issued in the corresponding Japanese Patent Application No. 2022-198366 with the English machine translation thereof.
(Continued)

*Primary Examiner* — Francis C Gray
(74) *Attorney, Agent, or Firm* — Carrier, Shende & Associates P.C.; Joseph P. Carrier; Fulchand P. Shende

(57) ABSTRACT

A pair of first electrodes 111, 112 is arranged in a state being separated in a direction parallel to a contact surface 102 of a base material 10 made of a dielectric and being at least partially in contact with the base material 10. A pair of second electrodes 121, 122 is arranged in a state of overlapping at least one of the pair of first electrodes and sandwiching the base material 10 at a position farther from the contact surface 102 of the base material 10 than the pair of first electrodes 111 and 112 in a direction perpendicular to the contact surface 102 of the base material 10. The proximity state of an object Q with respect to the contact surface
(Continued)

102 of the base material 10 is detected according to the measurement result of the capacitance C1 between the pair of first electrodes 111 and 112.

8 Claims, 8 Drawing Sheets

(58) Field of Classification Search
CPC ...... H03K 2217/960705; H03K 2217/960765; H03K 2217/9651; H03K 17/962; H03K 17/955
See application file for complete search history.

(56) References Cited

U.S. PATENT DOCUMENTS

| | | |
|---|---|---|
| 2016/0277023 A1 | 9/2016 | Nakajima |
| 2017/0194960 A1 | 7/2017 | Bextermoeller et al. |
| 2017/0356812 A1 | 12/2017 | Madden et al. |
| 2018/0326456 A1* | 11/2018 | Park .................. G06F 3/0416 |
| 2018/0328799 A1* | 11/2018 | Park .................. G01L 1/144 |
| 2020/0125817 A1* | 4/2020 | Kim .................. G06V 40/1306 |
| 2020/0141818 A1* | 5/2020 | Bao .................. G01L 1/144 |

FOREIGN PATENT DOCUMENTS

| | | |
|---|---|---|
| JP | 2014-119306 A | 6/2014 |
| JP | 2016-173299 A | 9/2016 |
| WO | 2014/080924 A1 | 5/2014 |

OTHER PUBLICATIONS

Extended European Search Report dated Oct. 25, 2022 issued i the corresponding EP Patent Application No. 20871933.6.

Hyung-Kew Lee et al., "Dual-Mode Capacitive Proximity Sensor for Robot Application: Implementation of Tactile and Proximity Sensing Capability on a Single Polymer Platform Using Shared Electrodes", IEEE Sensors Journal, IEEE, USA, vol. 9, No. 12, Dec. 1, 2009, pp. 1748-1755.

Office Action dated Jul. 7, 2023, issued in the corresponding EP Patent Application No. 20 871 933.6.

\* cited by examiner

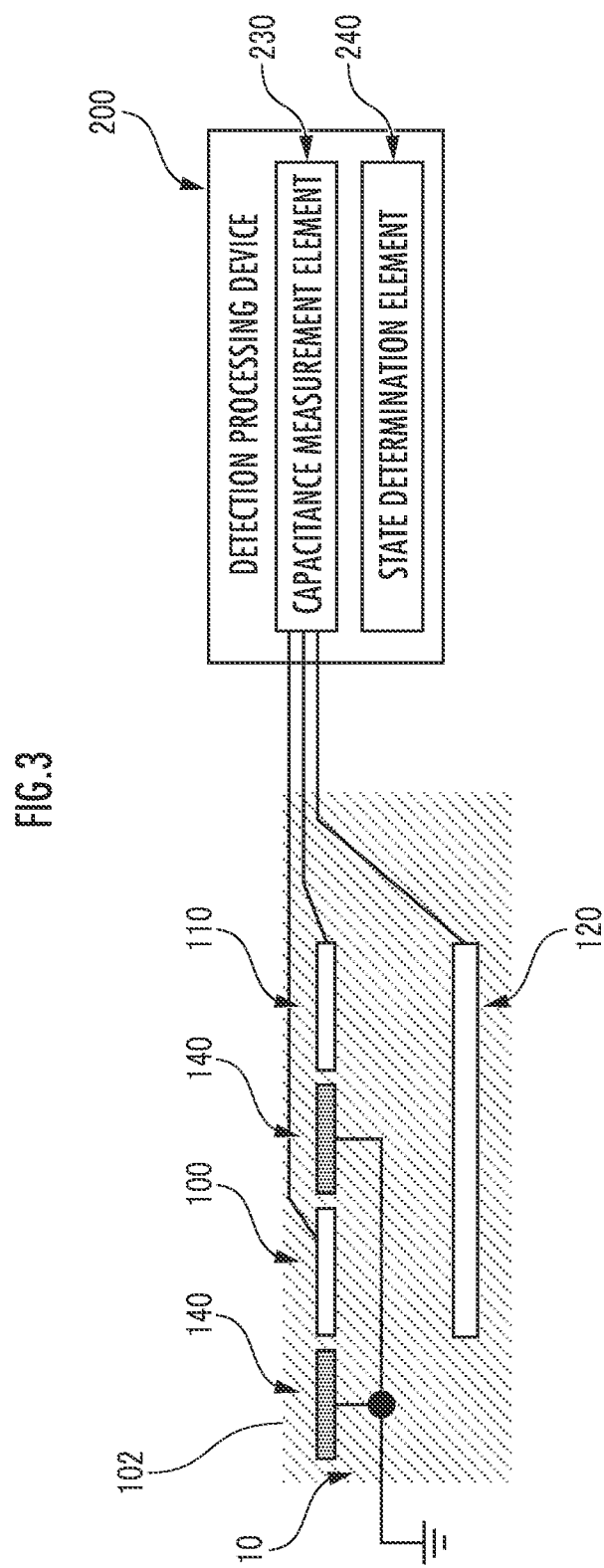

CAPACITANCE DETECTION SENSOR, CAPACITANCE DETECTION SENSOR MODULE AND STATE DETERMINATION METHOD USING CAPACITANCE DETECTION SENSOR

TECHNICAL FIELD

The present invention relates to a capacitance detection sensor.

BACKGROUND ART

There has been proposed a technical method for preventing erroneous detection by an electrostatic switch due to water droplets or the like adhering to the electrostatic switch and simultaneously detecting a contact (proximity) with the electrostatic switch and a degree of pressing (pressure) against the electrostatic switch (see, for example, Patent Literature 1). For example, the approach of a human body part such as a finger is detected according to a change in capacitance between a pad electrode and one wiring electrode, and the pressure applied to conductive rubber by the human body part is detected according to an electric resistance value when a current flows through the pad electrode, the conductive rubber, and the other wiring electrode.

CITATION LIST

Patent Literature

Patent Literature 1: JP 2016-173299 A (particularly paragraphs 0037 to 0039 and FIG. 11)

SUMMARY OF INVENTION

Technical Problem

However, due to variations or changes in the conductive characteristics of the conductive rubber, a change in the electric resistance value may not be detected even when pressure starts to be applied to the conductive rubber by the human body part, so that it can be erroneously detected that the human body part is separated from the conductive rubber.

Therefore, the present invention is intended to provide a capacitance detection sensor capable of improving the detection accuracy of the presence or absence of proximity of an object such as a human body and pressure received from the object.

Solution to Problem

A capacitance detection sensor according to a first aspect of the present invention includes: a base material made of a dielectric; a pair of first electrodes arranged such that lines of electric force three-dimensionally separated and connecting electrodes pass through a contact surface of the dielectric and are at least partially in contact with the base material; and a pair of second electrodes that at least partially overlap at least one first electrode of the pair of first electrodes and face each other with the base material in between, at a position farther from the surface of the base material than the pair of first electrodes in the direction perpendicular to the surface of the base material.

A capacitance detection sensor module according to the first aspect of the present invention includes: the capacitance detection sensor according to the first aspect of the present invention; and a detection processing device that applies a voltage between the pair of first electrodes, detects a proximity state of an object to a surface of the base material according to a capacitance between the pair of first electrodes, applies a voltage between the pair of second electrodes, and detects pressure acting on the base material from the object in contact with the surface of the base material according to a capacitance between the pair of second electrodes.

According to the capacitance detection sensor or the capacitance detection sensor module in the first aspect of the present invention, capacitance $C1$ between the pair of first electrodes is measured, and capacitance $C2$ between the pair of second electrodes is measured. Then, a plurality of states is determined on the basis of a capacitance value $Cp$ between the pair of first electrodes in a state where an object is not in proximity to and in contact with the base material, a capacitance value $Cp\_min$ between the pair of first electrodes in a state where the object is in contact with the base material, and a capacitance value $Cf$ between the pair of second electrodes in a state where there is no pressure from the object on the base material.

Specifically, (1) when $C1=Cp$ and $C2=Cf$, it is determined that the base material is in the state where there is no proximity and contact of the object to the base material. (2) When $Cp\_min<C1<Cp$ and $C2=Cf$, it is determined that the base material is in the state where the object is in proximity to the base material. (3) When $C1=Cp\_min$ and $C2=Cf$, it is determined that the base material is in the state where the object is in contact with the base material. (4) When $Cp\_min<C1<Cp$ and $C2>Cf$, or $C1>Cp$ and $C2>Cf$, it is determined that the base material is in the state where pressure from the object is acting on the base material. The base material has electrical insulation, and each state can be stably determined with high accuracy almost independently of the conductive characteristics of the base material.

The capacitance detection sensor or the capacitance detection sensor module according to the first aspect of the present invention preferably further includes an electrostatic shielding member that is arranged between the pair of first electrodes and the pair of second electrodes so as to be grounded at least partially overlapping the pair of first electrodes and the pair of second electrodes as seen in the direction perpendicular to the surface of the base material.

According to the capacitance detection sensor or the capacitance detection sensor module configured as described above, it is possible to avoid a reduction in the measurement accuracy of the capacitance $C2$ between the pair of second electrodes due to the electrostatic interaction between the object approaching the base material and the pair of second electrodes, thereby improving the determination accuracy of each state.

A capacitance detection sensor according to a second aspect of the present invention includes: a base material made of a dielectric; a reference electrode and a first electrode arranged such that lines of electric force three-dimensionally separated and connecting electrodes pass through a contact surface of the dielectric and are at least partially in contact with the base material; and a second electrode arranged to face the reference electrode so as to sandwich the base material together with the reference electrode at a position farther from the surface of the base material than the first electrode in a direction perpendicular to the surface of the base material.

A capacitance detection sensor module according to a second aspect of the present invention includes: the capacitance detection sensor according to the second aspect of the present invention; a detection processing device that alternately switches between a first detection period in which a voltage is applied between the reference electrode and the first electrode and a second detection period in which a voltage is applied between the reference electrode and the second electrode, detects a proximity state of an object to a surface of the base material according to a capacitance between the reference electrode and the first electrode in the first detection period, and detects a pressure acting on the base material from the object in contact with the surface of the base material according to a capacitance between the reference electrode and the second electrode in the second detection period.

According to the capacitance detection sensor or the capacitance detection sensor module in the second aspect of the present invention, a capacitance C1 between the reference electrode and the first electrode is measured in the first detection period in which a voltage is applied between the reference electrode and the first electrode. A capacitance C2 between the reference electrode and the second electrode is measured in the second detection period in which a voltage is applied between the reference electrode and the second electrode. Then, a plurality of states is determined on the basis of a capacitance value Cp between the reference electrode and the first electrode in a state where an object is not in proximity to and in contact with the base material, a capacitance value Cp_min between the reference electrode and the first electrode in a state where the object is in contact with the base material, and a capacitance value Cf between the reference electrode and the second electrode in a state where there is no pressure from the object on the base material.

Specifically, (1) when C1=Cp and C2=Cf, it is determined that the base material is in the state where there is no proximity and contact of the object to the base material. (2) When Cp_min<C1<Cp and C2=Cf, it is determined that the base material is in the state where the object is in proximity to the base material. (3) When C1=Cp_min and C2=Cf, it is determined that the base material is in the state where the object is in contact with the base material. (4) When C2>Cf, it is determined that the base material is in the state where pressure is acting on the base material from the object. The base material has electrical insulation, and each state can be stably determined with high accuracy almost independently of the conductive characteristics of the base material.

The capacitance detection sensor or the capacitance detection sensor module according to the second aspect of the present invention preferably further includes an electrostatic shielding member arranged in a grounded state between the reference electrode and the first electrode in a direction parallel to the surface of the base material.

According to the capacitance detection sensor or the capacitance detection sensor module configured as described above, it is possible to avoid a reduction in the measurement accuracy of the capacitance C2 between the reference electrode and the second electrode due to the electrostatic interaction between the object approaching the base material and the second electrode, thereby improving the determination accuracy of each state.

BRIEF DESCRIPTION OF DRAWINGS

FIG. 3 is an explanatory diagram of configurations of a capacitance detection sensor and a capacitance detection sensor module as a second embodiment of the present invention.

DESCRIPTION OF EMBODIMENTS (Configuration of Capacitance Detection Sensor (First Embodiment))

Figure 1:
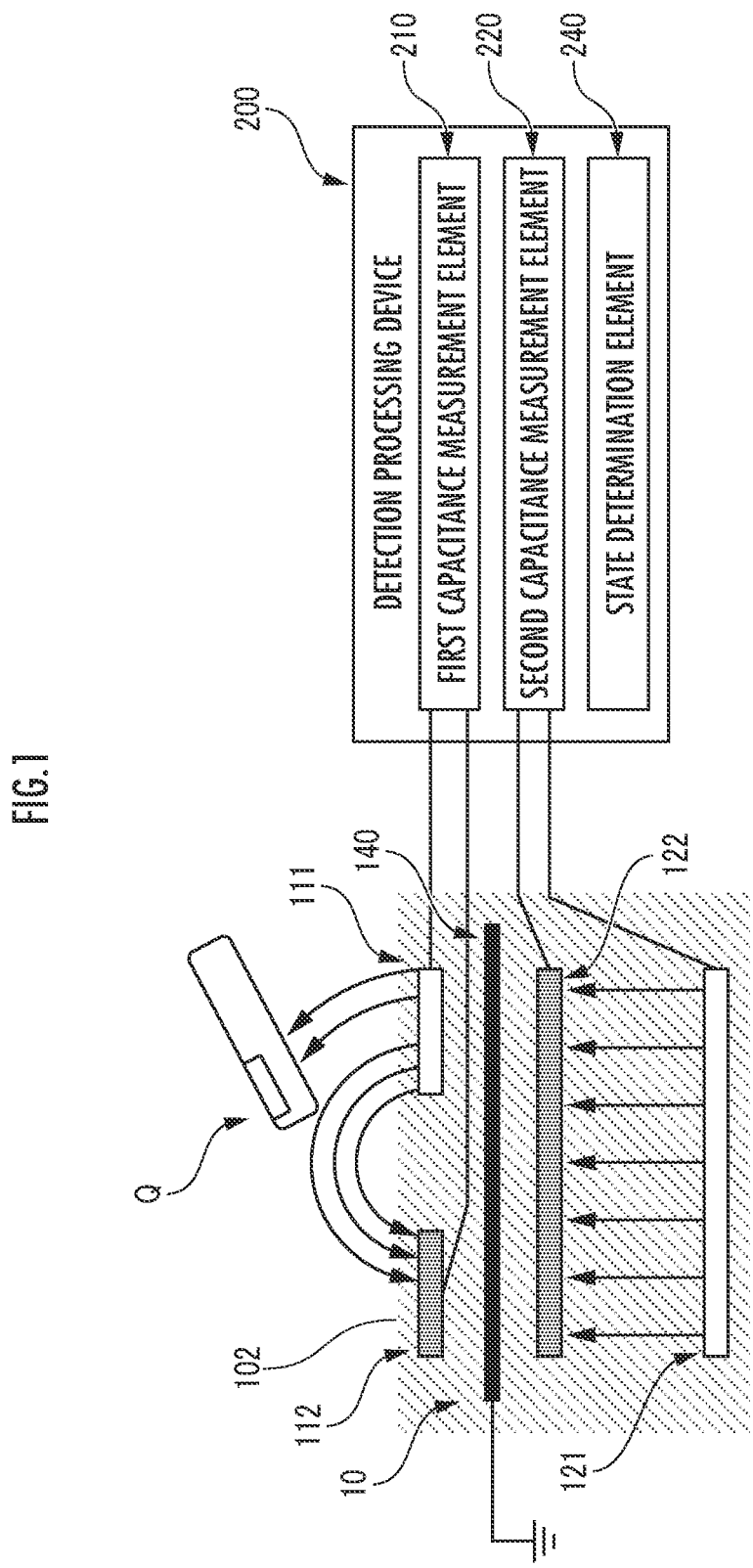
FIG. 1 is an explanatory diagram of configurations of a capacitance detection sensor and a capacitance detection sensor module as a first embodiment of the present invention.

A capacitance detection sensor as a first embodiment of the present invention illustrated in FIG. 1 includes a base material 10, a pair of first electrodes 111 and 112, a pair of second electrodes 121 and 122, and an electrostatic shielding member 140. A capacitance detection sensor module according to the first embodiment of the present invention includes the capacitance detection sensor according to the first embodiment of the present invention and a detection processing device 200. The electrostatic shielding member 140 may be omitted.

The base material 10 is made of a dielectric such as PVC gel, polyvinylidene fluoride (PVDF), polydimethylsiloxane (PDMS), a silicon-based resin, a urethane-based resin, or epoxy-based resin, or a composite material of any combination thereof. The pair of first electrodes 111 and 112 is arranged apart from each other in a direction parallel to a contact surface 102 of the base material 10, and is embedded in the base material 10 with a gap interposed between the first electrodes and a dielectric constituting the base material 10 in a direction in which the sensitivity in the shearing direction needs to be increased. The pair of second electrodes 121 and 122 is embedded in the base material 10 so as to face each other at a position farther from the contact surface 102 of the base material 10 than the pair of first electrodes 111 and 112 in a direction perpendicular to the contact surface 102 of the base material 10. The electrostatic shielding member 140 is arranged between the pair of first electrodes 111 and 112 and the pair of second electrodes 121 and 122 so as to at least partially overlap each of the pair of first electrodes 111 and 112 and the pair of second electrodes 121 and 122 as seen in the direction perpendicular to the contact surface 102 of the base material 10, and is embedded in the base material 10 in a grounded state. The pair of first electrodes 111 and 112, the pair of second electrodes 121 and 122, and the electrostatic shielding member 140 are each made of a metal such as carbon, silver, gold, or a liquid metal, a conductive resin such as a thiophene-based conductive polymer or PSS, PVC gel, polyvinylidene fluoride (PVDF), polydimethylsiloxane (PDMS), a silicon-based resin, a urethane-based resin, or an epoxy-based resin, or a dielectric such as a composite material of any combination thereof, or a composite material of any combination thereof. For example, the capacitance detection sensor may be produced by forming each of the first electrodes 111 and 112, the second electrodes 121 and 122, and the electrostatic shielding member 140 by a conductive paste printed in a predetermined pattern on a sheet of a dielectric, and then stacking and integrating the plurality of dielectric sheets.

The detection processing device 200 is configured by a computer including a microprocessor, a memory, and the like. The detection processing device 200 includes a first capacitance measurement element 210, a second capacitance measurement element 220, and a state determination element 240. The first capacitance measurement element 210 applies a voltage between the pair of first electrodes 111 and 112, and measures the potential difference between the pair of first electrodes 111 and 112 at this time, and thus the capacitance C1. The state determination element 240 detects the proximity state of an object Q with respect to the contact surface 102 of the base material 10 according to the measurement result of the capacitance C1 between the pair of first electrodes 111 and 112. The second capacitance measurement element 220 applies a voltage between the pair of second electrodes 121 and 122, and measures the potential difference between the pair of second electrodes 121 and 122 at this time, and thus the capacitance C2. The state determination element 240 detects the pressure acting on the base material 10 from the object Q in contact with the contact surface 102 of the base material 10 according to the measurement result of the capacitance C2 between the pair of second electrodes 121 and 122.

(Functions of Capacitance Detection Sensor (First Embodiment))

According to the capacitance detection sensor or the capacitance detection sensor module as the first embodiment of the present invention, a voltage is applied between the pair of first electrodes 111 and 112 (see the lines of electric force represented by the curved arrows in FIG. 1), and the capacitance C1 between the pair of first electrodes 111 and 112 is measured based on the potential difference between the pair of first electrodes 111 and 112 at this time. A voltage is applied between the pair of second electrodes 121 and 122 (see the lines of electric force represented by the upward arrows in FIG. 1), and the capacitance C2 between the pair of second electrodes 121 and 122 is measured based on the potential difference between the pair of second electrodes 121 and 122 at this time. A voltage may be applied to the pair of second electrodes 121 and 122 such that the lower second electrode 121 has a higher potential than the upper second electrode 122, or a voltage may be applied to the pair of second electrodes 121 and 122 such that the lower second electrode 121 has a lower potential than the upper second electrode 122.

Then, a plurality of states is determined on the basis of a capacitance value $C_p$ between the pair of first electrodes 111 and 112 in a state where the object Q that is a part of a human body such as a finger of a hand is not in proximity to and in contact with the base material 10, a capacitance value $C_{p\_min}$ between the pair of first electrodes 111 and 112 in a state where the object Q is in contact with the base material 10, and a capacitance value $C_f$ between the pair of second electrodes 121 and 122 in a state where there is no pressure from the object Q on the base material 10.

Specifically, (1) when $C1=C_p$ and $C2=C_f$, it is determined that the base material 10 is in the state where there is no proximity and contact of the object Q to the base material 10. (2) When $C_{p\_min}<C1<C_p$ and $C2=C_f$, it is determined that the base material 10 is in the state where the object Q is in proximity to the base material 10. (3) When $C1=C_{p\_min}$ and $C2=C_f$, it is determined that the base material 10 is in the state where the object Q is in contact with the base material 10. (4) When $C_{p\_min}<C1<C_p$ and $C2>C_f$, it is determined that the base material 10 is in the state where a relatively weak pressure acts on the base material 10 from the object Q. (5) When $C1>C_p$ and $C2>C_f$, it is determined that the base material 10 is in the state where a relatively strong pressure acts on the base material 10 from the object Q. Table 1 collectively shows the measurement results of the capacitance C1 between the pair of first electrodes 111 and 112 and the determination results of the states according to the measurement results of the capacitance C2 between the pair of second electrodes 121 and 122.

TABLE 1

| C1 | C2 | State |
| --- | --- | --- |
| $C1 = C_p$ | $C2 = C_f$ | No proximity or contact |
| $C_{p\_min} < C1 < C_p$ | $C2 = C_f$ | Proximity |
| $C1 = C_{p\_min}$ | $C2 = C_f$ | Abutment |
| $C_{p\_min} < C1 < C_p$ | $C_f < C2$ | Weak pressure |
| $C_p < C1$ | $C_f < C2$ | Strong pressure |

Figure 2:
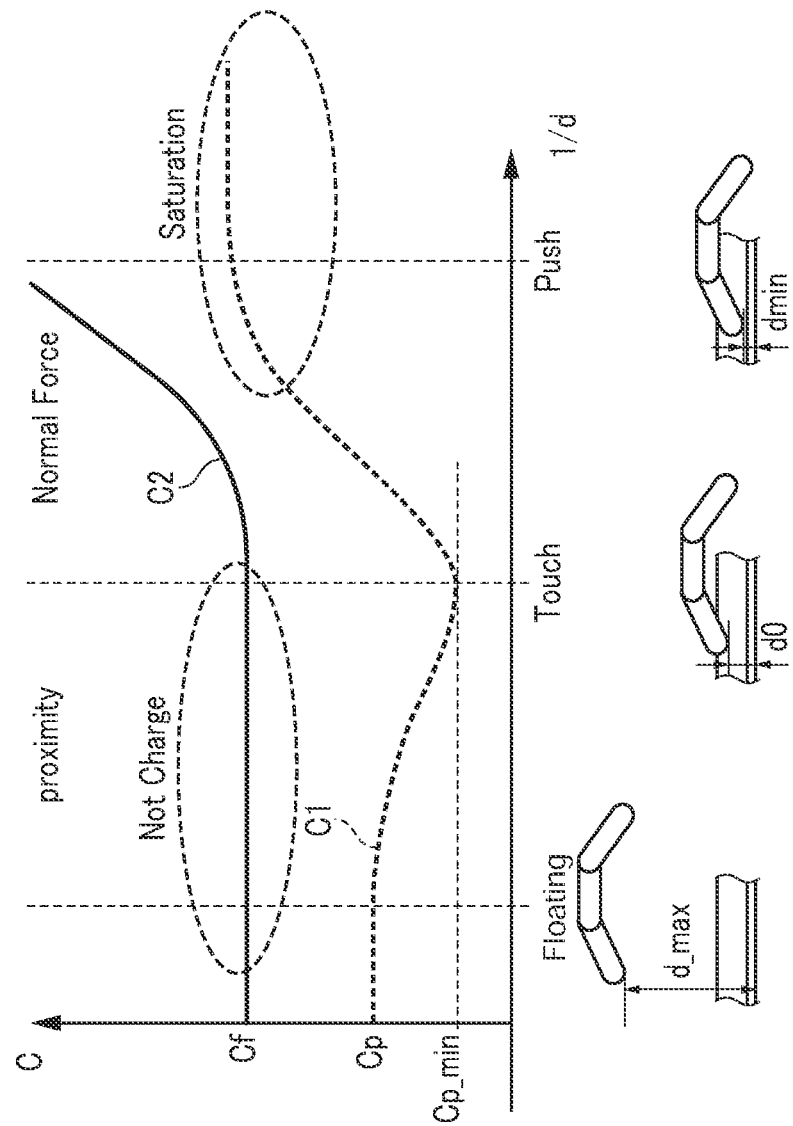
FIG. 2 is an explanatory diagram of functions of the capacitance detection sensor as the first embodiment of the present invention.

FIG. 2 illustrates change modes of the capacitance C1 between the pair of first electrodes 111 and 112 and the capacitance C2 between the pair of second electrodes 121 and 122 with the state transitions from (1) to (5). By the electrostatic shielding member 140, it is possible to avoid a reduction in the measurement accuracy of the capacitance C2 between the pair of second electrodes 121 and 122 due to the electrostatic interaction between the object Q approaching the base material 10 and the pair of second electrodes 121 and 122, thereby improving the determination accuracy of each state.

(Functions of Capacitance Detection Sensor (Second Embodiment))

A capacitance detection sensor as a second embodiment of the present invention illustrated in FIG. 3 includes a base material 10, a reference electrode 100, a first electrode 110, and a second electrode 120. A capacitance detection sensor module according to the second embodiment of the present invention includes the capacitance detection sensor according to the second embodiment of the present invention and a detection processing device 200. The electrostatic shielding member 140 may be omitted.

The base material 10 is made of a dielectric such as PVC gel, polyvinylidene fluoride (PVDF), polydimethylsiloxane (PDMS), a silicon-based resin, a urethane-based resin, or epoxy-based resin, or a composite material of any combination thereof. The reference electrode 100 and the first electrode 110 are arranged apart from each other in a direction parallel to a contact surface 102 of the base material 10, and is embedded in the base material 10 with a gap interposed between the first electrodes and a dielectric constituting the base material 10 in a direction in which the sensitivity in the shearing direction needs to be increased. The second electrode 120 is embedded in the base material 10 so as to face the reference electrode 100 at a position farther from the contact surface 102 of the base material 10 than the first electrode 110 in a direction perpendicular to the contact surface 102 of the base material 10. The electrostatic shielding member 140 is arranged between the reference electrode 100 and the first electrode 110 in a direction parallel to the contact surface 102 of the base material 10, and is embedded in the base material 10 in a grounded state. The reference electrode 100, the first electrode 110, the second electrode 120, and the electrostatic shielding member 140 are each made of a metal such as carbon, silver, gold, or a liquid metal, a conductive resin such as a thiophene-based conductive polymer or PSS, PVC gel, polyvinylidene fluoride (PVDF), polydimethylsiloxane (PDMS), a silicon-based resin, a urethane-based resin, or an epoxy-based resin, or a dielectric such as a composite material of any combination thereof, or a composite material of any combination thereof. For example, the capacitance detection sensor may be produced by forming each of the reference electrode 100, the first electrode 110, the second electrode 120, and the electrostatic shielding member 140 by a conductive paste printed in a predetermined pattern on a sheet of a dielectric, and then stacking and integrating the plurality of dielectric sheets.

In the first embodiment, the pair of first electrodes 111 and 112, the one second electrode 122, and the other second electrodes 121 are arranged at three places or on three layers having different distances from the contact surface 102 of the base material 10 (see FIG. 1). However, in the second embodiment, the reference electrode 100, the first electrode 110, and the second electrode 120 are arranged at two places or on two layers having different distances from the surface 102 (see FIG. 3). Therefore, in the second embodiment, the arrangement space of the plurality of electrodes can be made compact and the capacitance detection sensor can be made thinner than in the first embodiment in the direction perpendicular to the contact surface 102 of the base material 10.

Figure 5A:
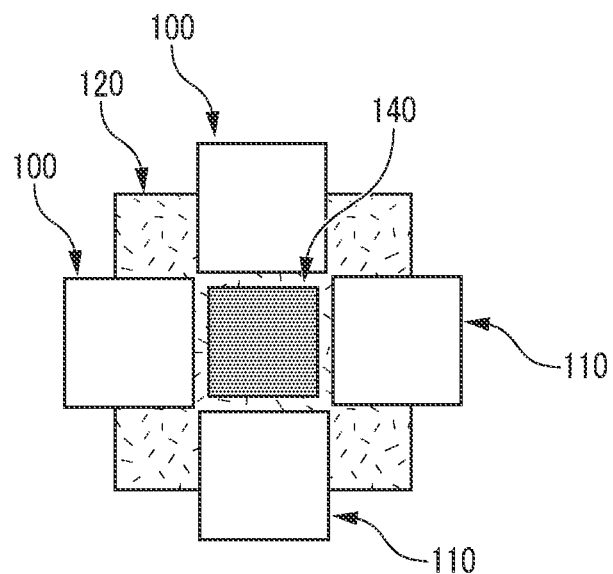
FIG. 5A is an explanatory diagram of functions in a first detection period of a capacitance detection sensor as a second embodiment of the present invention.
Figure 5B:
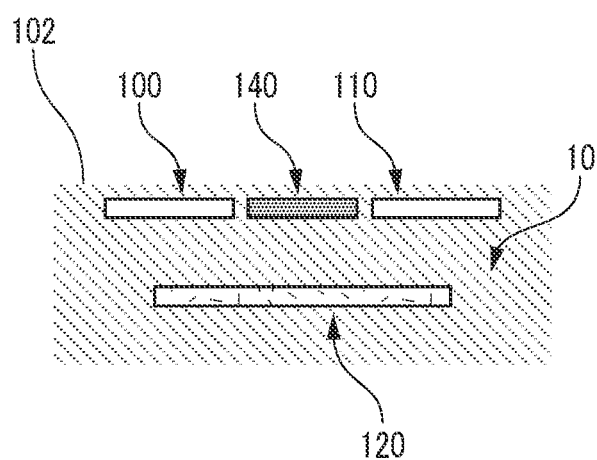
FIG. 5B is an explanatory diagram of functions in a second detection period of a capacitance detection sensor as the second embodiment of the present invention.

As shown in FIGS. 5A and 5B, an existing configuration in which five substantially square electrodes are arranged in a cross shape and buried in a first layer of the base material 10, and a substantially square electrode having a large area is buried in a second layer of the base material 10 so as to overlap the five substantially square electrodes will be considered. In this case, the central electrode arranged in the first layer may be used as the electrostatic shielding member 140, the first pair of electrodes adjacent to the central electrode may be used as the reference electrode 100, the second pair of electrodes adjacent to the central electrode may be used as the first electrode 110, and the electrode arranged in the second layer may be used as the second electrode 120. By using the existing configuration in this manner, a capacitance detection sensor as an example according to the second embodiment is configured.

The detection processing device 200 is configured by a computer including a microprocessor, a memory, and the like. The detection processing device 200 includes a capacitance measurement element 230 and a state determination element 240. The capacitance measurement element 230 alternately switches between a first detection period in which a voltage is applied between the reference electrode 100 and the first electrode 110 and a second detection period in which a voltage is applied between the reference electrode 100 and the second electrode 120. The capacitance measurement element 230 measures a capacitance C1 between the reference electrode 100 and the first electrode 110 in the first detection period. The state determination element 240 detects the proximity state of an object Q with respect to the contact surface 102 of the base material 10 according to the measurement result. The capacitance measurement element 230 measures a capacitance C2 between the reference electrode 100 and the second electrode 120 in the second detection period. The state determination element 240 detects the pressure acting on the base material 10 from the object Q in contact with the contact surface 102 of the base material 10 according to the measurement result.

(Functions of Capacitance Detection Sensor (Second Embodiment))

Figure 4A:
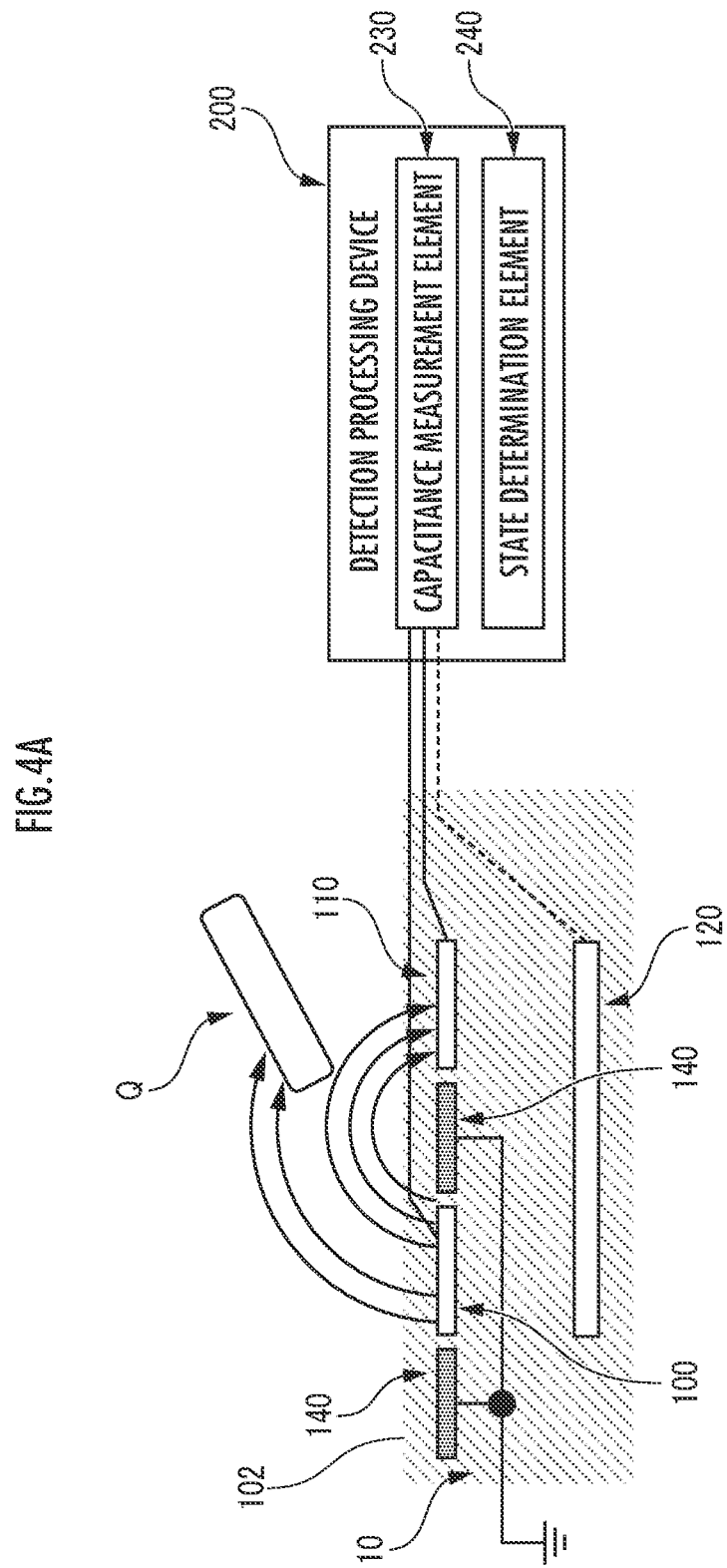
FIG. 4A is an explanatory diagram of a configuration of a capacitance detection sensor as an example of the present invention.

According to the capacitance detection sensor or the capacitance detection sensor module as the second embodiment of the present invention, a voltage is applied between the reference electrode 100 and the first electrode 110 in the first detection period (see the lines of electric force represented by the curved arrows in FIG. 4A). A voltage may be applied between the reference electrode 100 and the first electrode 110 such that the reference electrode 100 has a higher potential than the first electrode 110, or a voltage may be applied between the reference electrode 100 and the first electrode 110 such that the reference electrode 100 has a lower potential than the first electrode 110. At this time, the potential difference between the reference electrode 100 and the first electrode 110, and eventually, the capacitance C1 are measured.

Figure 4B:
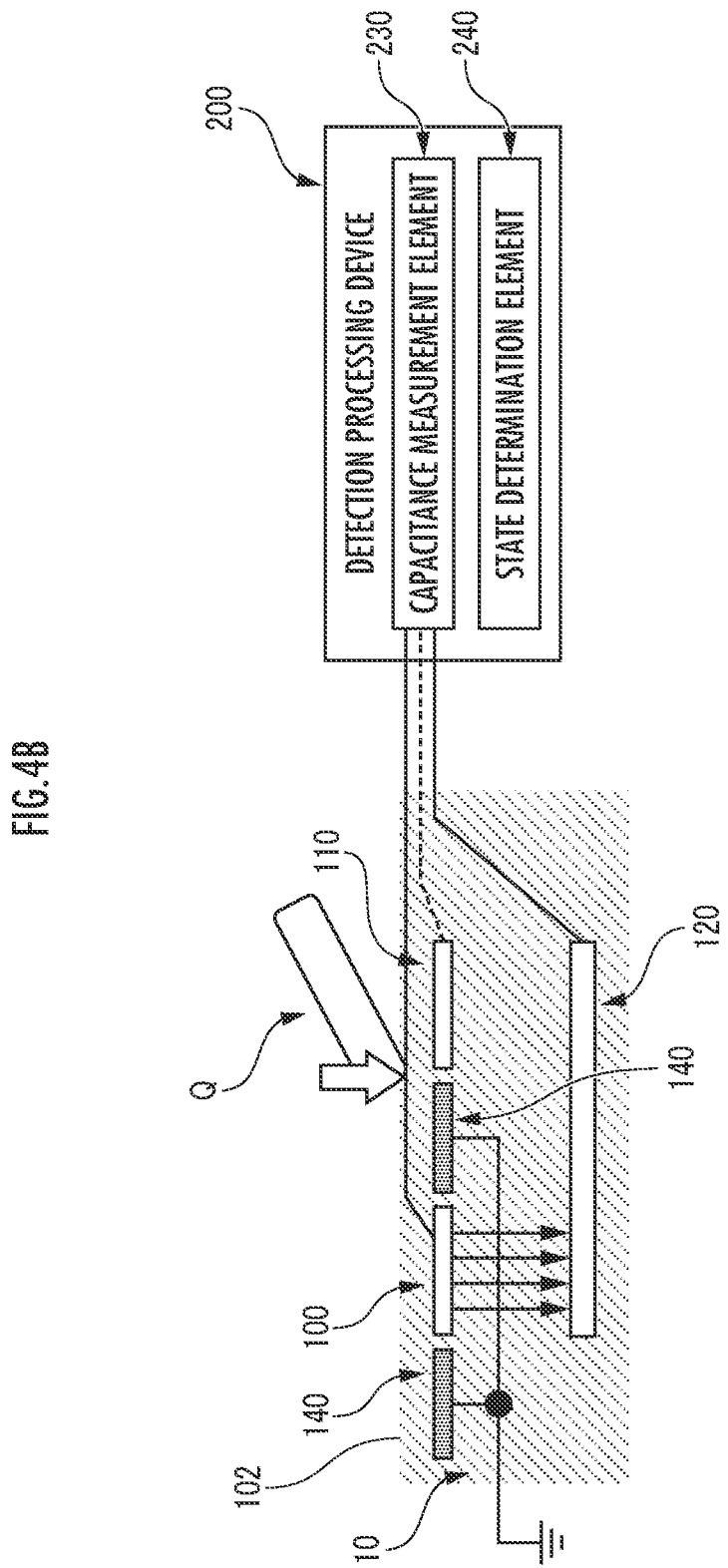
FIG. 4B is an explanatory diagram of a configuration of a capacitance detection sensor as an example of the present invention.

In the second detection period, a voltage is applied between the reference electrode 100 and the second electrode 120 (see the lines of electric force represented by the downward arrows in FIG. 4B). A voltage may be applied between the reference electrode 100 and the second electrode 120 such that the reference electrode 100 has a higher potential than the second electrode 120, or a voltage may be applied between the reference electrode 100 and the second electrode 120 such that the reference electrode 100 has a lower potential than the second electrode 120. At this time, the potential difference between the reference electrode 100 and the second electrode 120, and eventually the capacitance C2 are measured.

Then, a plurality of states is determined on the basis of a capacitance value Cp between the reference electrode 100 and the first electrode 110 in a state where the object Q is not in proximity to and in contact with the base material 10, a capacitance value Cp_min between the reference electrode 100 and the first electrode 110 in a state where the object is in contact with the base material 10, and a capacitance value Cf between the reference electrode 100 and the second electrode 120 in a state where there is no pressure from the object on the base material 10. This determination method is similar to the determination method of the first embodiment shown in Table 1.

By the electrostatic shielding member 140, it is possible to avoid a reduction in the measurement accuracy of the capacitance C2 between the reference electrode 100 and the second electrode 120 due to the electrostatic interaction between the object Q approaching the base material 10 and the second electrode 120, thereby improving the determination accuracy of each state.

Figure 6A:
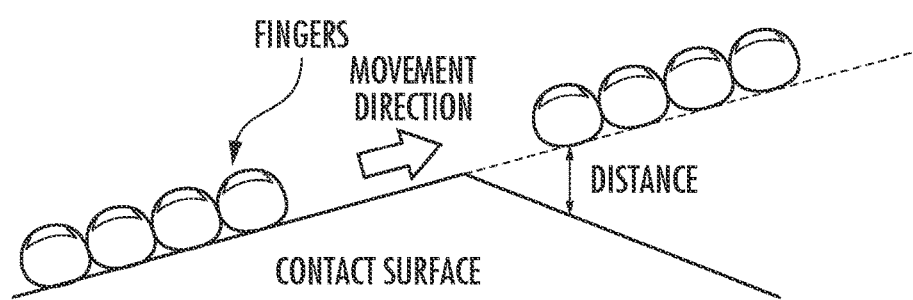
FIG. 6A is an explanatory diagram of a state in which a plurality of fingers strokes a surface of an object and then gradually separates from the surface of the object.
Figure 6B:
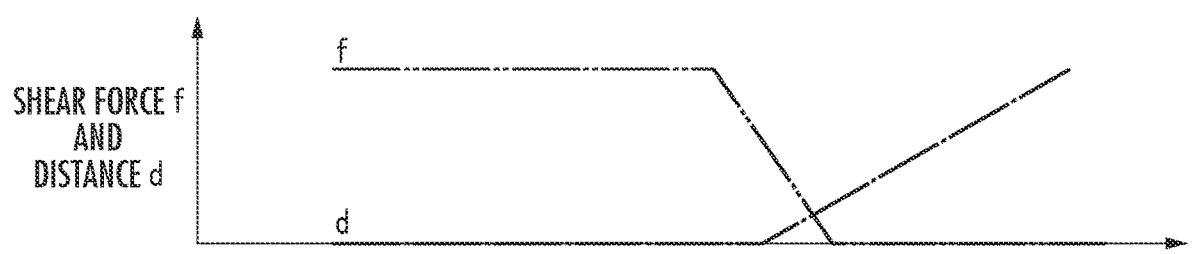
FIG. 6B is an explanatory diagram of a mean separation between the plurality of fingers and the object and a change mode of a mean shearing force.

For example, as schematically illustrated in FIG. 6A, a case where an object having a plurality of capacitance detection sensors according to the present invention disposed on the surface is stroked with four fingers of one hand, and then the four fingers are separated from the object will be considered. In this case, as indicated by the alternate long and short dash line in FIG. 6B, an average distance d between all the fingers and the object is 0 while all the fingers stroke the object, and then gradually increases as some of the fingers move away from the object. In addition, as indicated by the two-dot chain line in FIG. 6B, an average shear force f applied from the finger to the object is substantially constant while all the fingers stroke the object, and then gradually decreases as some of the fingers move away from the object, and becomes 0 when all the fingers move away from the object.

Figure 7A:
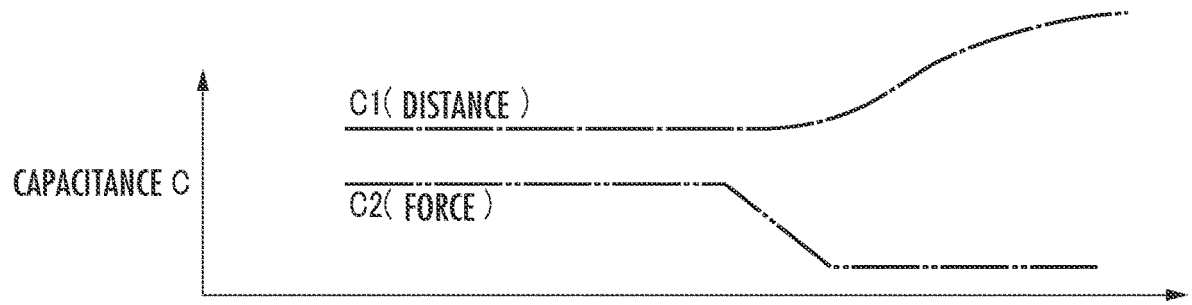
FIG. 7A is an explanatory view of a change mode of capacitances C1 (total value) and C2 (total value) in a case where capacitance detection sensors as the first embodiment of the present invention are dispersedly arranged on the surface of the object.

In a case where the capacitance detection sensors as the first embodiment of the present invention are arranged on the surface of the object, as indicated by the one-dot chain line in FIG. 7A, the total value of the capacitance C1 between the pair of first electrodes 111 and 112 is 0 while all the fingers stroke the object, and then gradually increases as some of the fingers move away from the object, and is saturated at a certain value. In addition, as indicated by the two-dot chain line in FIG. 7A, the total value of the capacitance C2 between the pair of second electrodes 121 and 122 is substantially constant while all the fingers stroke the object, and then gradually decreases when some of the fingers move away from the object, and converges to a constant value when all the fingers are separated from the object by a predetermined distance or more.

Figure 7B:
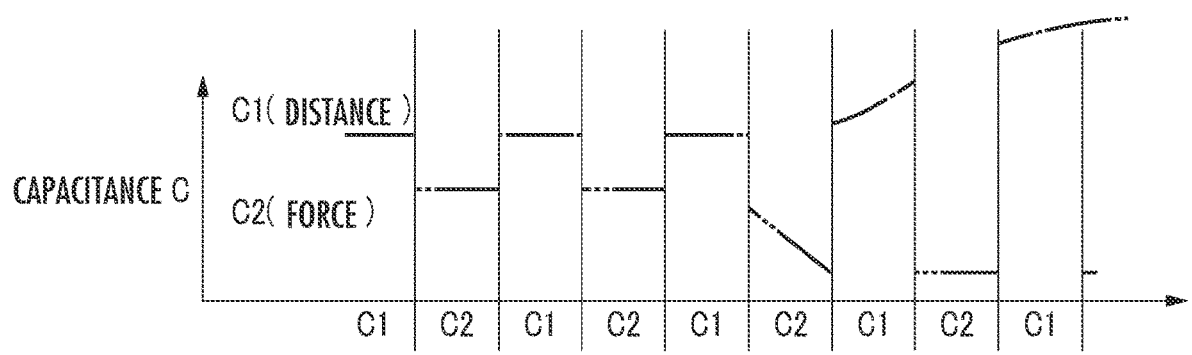
FIG. 7B is an explanatory view of a change mode of capacitances C1 (total value) and C2 (total value) in a case where capacitance detection sensors as the second embodiment of the present invention are dispersedly arranged on the surface of an object.

In a case where the capacitance detection sensors as the second embodiment of the present invention are arranged on the surface of the object, as indicated by the one-dot chain line in FIG. 7B, the total value of the intermittent capacitance C1 between the reference electrode 100 and the first electrode 110 in the first detection period is 0 while all the fingers stroke the object, and then gradually increases as some of the fingers move away from the object, and is saturated at a certain value. In addition, as indicated by the two-dot chain line in FIG. 7B, the total value of the intermittent capacitance C2 between the reference electrode 100 and the second electrode 120 in the second detection period is substantially constant while all the fingers stroke the object, and then gradually decreases when some of the fingers move away from the object, and converges to a constant value when all the fingers are separated from the object by a predetermined distance or more.

Other Embodiment of the Present Invention

In the first embodiment, the pair of first electrodes 111 and 112 is entirely embedded in the base material 10 in a state of being separated from each other in the direction parallel to the contact surface 102 of the base material 10 (see FIG. 2). However, in another embodiment, at least one of the pair of first electrodes 111 and 112 may be attached to the surface of the base material 10 or partially embedded in the base material 10 so as to be partially exposed (for example, one main surface of the plate electrode is exposed). In addition, the pair of first electrodes 111 and 112 do not need to be separated from each other in the parallel direction as long as the lines of electric force that are three-dimensionally separated and connect the electrodes pass through the contact surface 102 of the dielectric. The exposed portion may be protected by an insulating sheet. In the first embodiment, the pair of second electrodes 121 and 122 are both entirely embedded in the base material 10 (see FIG. 1). However, in another embodiments, at least one of the pair of second electrodes 121 and 122 may be attached to the surface of the base material 10 or partially embedded in the base material 10 so as to be partially exposed (for example, a part of one main surface of the flat plate electrode is exposed). The exposed portion may be protected by an insulating sheet.

In the second embodiment, the reference electrode 100, the first electrode 110, and the second electrode 120 are all entirely embedded in the base material 10 (see FIG. 3). However, in another embodiment, at least one of the electrodes may be attached to the surface of the base material 10 or partially embedded in the base material 10 so as to be partially exposed (for example, one main surface of the flat plate electrode is exposed). The exposed portion may be protected by an insulating sheet.

REFERENCE SIGNS LIST

10 Base material
102 Contact surface
100 Reference electrode
110, 111, 112 First electrode
120, 121, 122 Second electrode
140 Electrostatic shielding member
200 Detection processing device
210 First capacitance measurement element
220 Second capacitance measurement element
230 Capacitance measurement element
240 State determination element

The invention claimed is:

1. A capacitance detection sensor comprising:
   a base material made of a dielectric;
   a pair of first electrodes arranged at least partially in contact with the base material and apart from each other; and
   a pair of second electrodes that at least partially overlap at least one first electrode of the pair of first electrodes as seen in a direction perpendicular to the surface of the base material and face each other with the base material in between, at a position farther from the surface of the base material than the pair of first electrodes in the direction perpendicular to the surface of the base material.

2. The capacitance detection sensor according to claim 1, further comprising
   an electrostatic shielding member that is arranged between the pair of first electrodes and the pair of second electrodes so as to be grounded at least partially overlapping the pair of first electrodes and the pair of second electrodes as seen in the direction perpendicular to the surface of the base material.

3. A capacitance detection sensor module comprising:
   the capacitance detection sensor according to claim 1; and
   a detection processing device that applies a voltage between the pair of first electrodes, detects a proximity state of an object to a surface of the base material according to a capacitance between the pair of first electrodes, applies a voltage between the pair of second electrodes, and detects a pressure acting on the base material from the object in contact with the surface of the base material according to a capacitance between the pair of second electrodes.

4. A state determination method using the capacitance detection sensor according to claim 1, the state determination method comprising:
   measuring a capacitance C1 between the pair of first electrodes;
   measuring a capacitance C2 between the pair of second electrodes;

based on a capacitance value Cp between the pair of first electrodes in a state where an object is not in proximity to and in contact with the base material, a capacitance value Cp_min between the pair of first electrodes in a state where the object is in contact with the base material, and a capacitance value Cf between the pair of second electrodes in a state where there is no pressure from the object on the base material, when C1=Cp and C2=Cf, determining that the base material is in a state where there is no proximity and no contact of the object to the base material, when Cp_min<C1<Cp and C2=Cf, determining that the base material is in a state where the object is in proximity to the base material, when C1=Cp_min and C2=Cf, determining that the base material is in a state where the object is in contact with the base material, and when C2>Cf, determining that the base material is in a state where a pressure is acting on the base material from the object.

5. A capacitance detection sensor comprising:
a base material made of a dielectric; a reference electrode and a first electrode arranged at least partially in contact with the base material and apart from each other; and
a second electrode arranged to face the reference electrode so as to sandwich the base material together with the reference electrode at a position farther from the surface of the base material than the first electrode in a direction perpendicular to the surface of the base material.

6. The capacitance detection sensor according to claim 5, further comprising
an electrostatic shielding member arranged in a grounded state between the reference electrode and the first electrode in a direction parallel to the surface of the base material.

7. A capacitance detection sensor module comprising:
the capacitance detection sensor according to claim 5; and
a detection processing device that alternately switches between a first detection period in which a voltage is applied between the reference electrode and the first electrode and a second detection period in which a voltage is applied between the reference electrode and the second electrode, detects a proximity state of an object to a surface of the base material according to a capacitance between the reference electrode and the first electrode in the first detection period, and detects a pressure acting on the base material from the object in contact with the surface of the base material according to a capacitance between the reference electrode and the second electrode in the second detection period.

8. A state determination method using the capacitance detection sensor according to claim 5, the state determination method comprising:
measuring a capacitance C1 between the reference electrode and the first electrode in a first detection period in which a voltage is applied between the reference electrode and the first electrode;
measuring a capacitance C2 between the reference electrode and the second electrode in a second detection period in which a voltage is applied between the reference electrode and the second electrode; and
based on a capacitance value Cp between the reference electrode and the first electrode in a state where an object is not in proximity to and in contact with the base material, a capacitance value Cp_min between the reference electrode and the first electrode in a state where the object is in contact with the base material, and a capacitance value Cf between the reference electrode and the second electrode in a state where there is no pressure from the object on the base material, when C1=Cp and C2=Cf, determining that the base material is in a state where there is no proximity and no contact of the object to the base material, when Cp_min<C1<Cp and C2=Cf, determining that the base material is in a state where the object is in proximity to the base material, when C1=Cp_min and C2=Cf, determining that the base material is in a state where the object is in contact with the base material, and when C2>Cf, determining that the base material is in a state where a pressure is acting on the base material from the object.

* * * * *